(12) United States Patent
Street et al.

(10) Patent No.: US 7,742,090 B2
(45) Date of Patent: Jun. 22, 2010

(54) FLEXIBLE SEGMENTED IMAGE SENSOR

(75) Inventors: Robert A. Street, Palo Alto, CA (US); Sanjiv Sambandan, Palo Alto, CA (US); Jeng Ping Lu, San Jose, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 650 days.

(21) Appl. No.: 11/644,072

(22) Filed: Dec. 22, 2006

(65) Prior Publication Data

US 2008/0151089 A1 Jun. 26, 2008

(51) Int. Cl.
*H04N 3/14* (2006.01)
(52) U.S. Cl. .................. 348/294; 348/374; 348/264
(58) Field of Classification Search ........................ None
See application file for complete search history.

(56) References Cited

U.S. PATENT DOCUMENTS

| | | | | |
|---|---|---|---|---|
| 4,467,361 A | * | 8/1984 | Ohno et al. | ........... 348/340 |
| 5,004,328 A | * | 4/1991 | Suzuki et al. | ........... 359/664 |
| 6,233,100 B1 | * | 5/2001 | Chen et al. | ........... 359/727 |
| 6,881,943 B1 | * | 4/2005 | Yegnashankaran | ....... 250/208.1 |
| 7,176,968 B1 | * | 2/2007 | Saarelma | ........... 348/275 |
| 2004/0041914 A1 | * | 3/2004 | Peters, III | ........... 348/207.99 |

* cited by examiner

*Primary Examiner*—David L Ometz
*Assistant Examiner*—Angel L Garces-Rivera
(74) *Attorney, Agent, or Firm*—Marger Johnson & McCollom, P.C.

(57) ABSTRACT

A method of making a curved sensor is described. The method involves projecting portions of a curved three dimensional structure such as a hemisphere onto a two dimensional substrate in an outline pattern. The outline pattern typically serves as a perimeter of a sensor. After forming a sensor in the shape of the outline pattern, the two dimensional substrate is flexed to form a three dimensional sensor structure.

8 Claims, 14 Drawing Sheets

FLEXIBLE SEGMENTED IMAGE SENSOR

CROSS-REFERENCE TO RELATED APPLICATIONS

The current application is related to U.S. patent application Ser. No. 11/644,056 filed Dec. 22, 2006, entitled "Sensor Surface With 3D Curvature Formed By Electronics On A Continuous 2D Flexible Substrate" which was filed on the same day with the same assignee.

BACKGROUND

Image sensors have largely replaced film in imaging systems. Typical image sensors, such as charge coupled device (CCD) arrays and CMOS imagers are typically based on crystalline silicon substrates and are thus almost perfectly flat. However, flat image sensors can only handle light coming in from a narrow field of view. In order to widen the field of view, complicated, delicate and expensive lens systems are used to focus the light from a wider area onto the flat sensor. However, such lenses add weight and add significantly to imaging system expense.

Forming a curved image sensor has long been proposed as a means of creating wide angle imaging systems using relatively simple and light lens systems, because the focal plane of a simple light lens system generally forms a spherical section. Curved image sensors have other applications, including robotic sensor systems. However, forming a curved sensor has proven to be logistically difficult. Many semiconductor processes, such as photolithographic processes, are not easily adapted to implementation on a curved surface. In addition, when excessive stress is applied to crystalline sensor structures, sensor cracking may result.

Thus an effective inexpensive method of forming a curved, hemispherical shaped image sensor is needed.

SUMMARY

A method of forming a segmented curved image sensor is described. In the method, an array of individually addressable photo-detector pixels is formed over a planar surface of a flexible substrate in a pattern. The pattern perimeter is shaped to form, in a two-dimensional plane, at least a portion of a three dimensional curved image sensor. A force is then applied to flex the flexible substrate out of the two dimensional plane such that the matrix addressed pixel sensor curves to form at least a portion of the three-dimensional curved image sensor.

DETAILED DESCRIPTION

A method of fabricating a curved image sensor is described. In one embodiment of fabrication, a flexible sensor structure, such as an amorphous silicon image sensor, is fabricated on a flexible substrate in a two dimensional plane. The formation is typically done monolithically meaning that both the active elements (detectors) and the interconnect lines that relate to the sensor are formed on a single substrate. The outer perimeter of the sensor pixel array is designed such that a spiral pattern or other hemisphere segment is formed. The image sensor is then cut along the outline pattern and the substrate including the image sensor is bent or flexed into an approximate curved shape such as a hemisphere. As used herein, "hemisphere" and "hemispherical" are broadly defined as an approximately symmetrical curved concave object which may be, but is not necessarily, a portion of a sphere.

Figure 1:
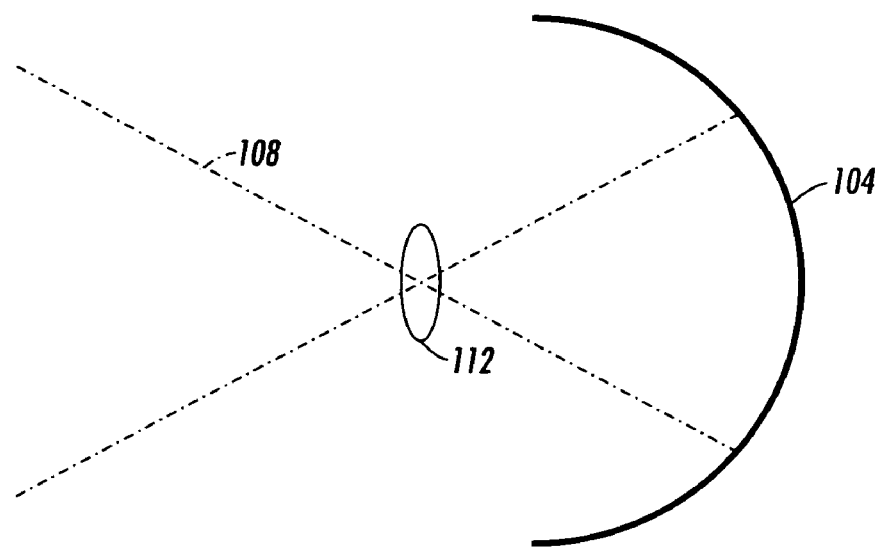
FIG. 1 shows a lens focusing light on a curved plane light detector.

FIG. 1 shows use of a curved focal plane light image sensor 104 in an imaging system. Light rays 108 from a wide area passes through lens 112. Lens 112 is designed to have a curved focal plane. A curved image sensor 104 is placed such that a curved light detecting surface of the sensor coincides with the curved focal plane of lens 112. For wide angle images, curved focal plane lenses such as lens 112, are easier to fabricate then traditional wide angle lenses. Various methods will be described to form the curved focal plane image sensor 104.

Figure 2:
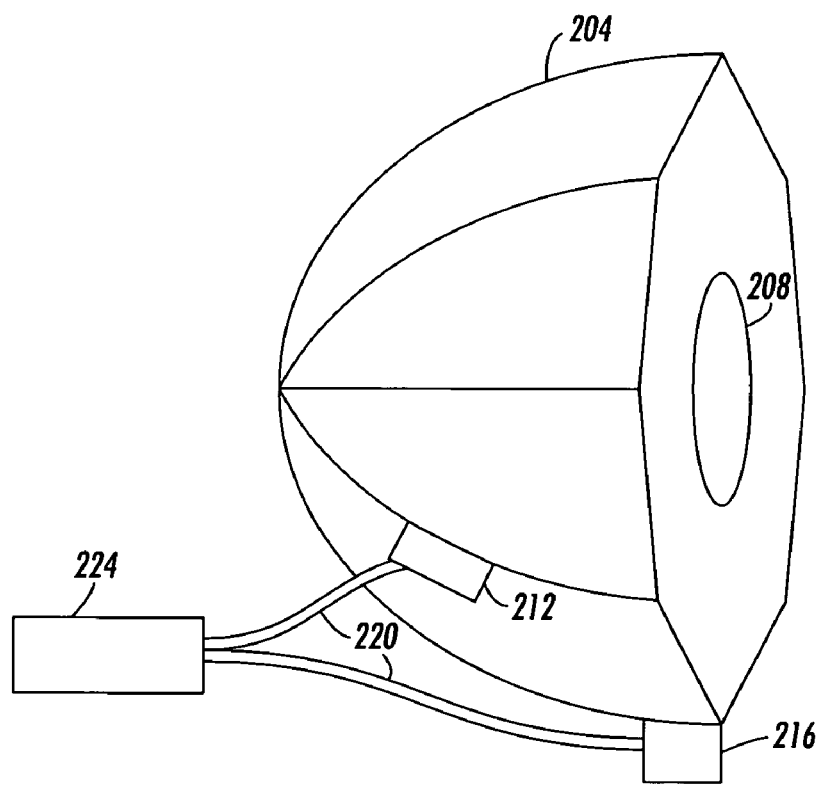
FIG. 2 shows a hemispherical sensor formed from hemispherical segments formed in a plane.
Figure 3:
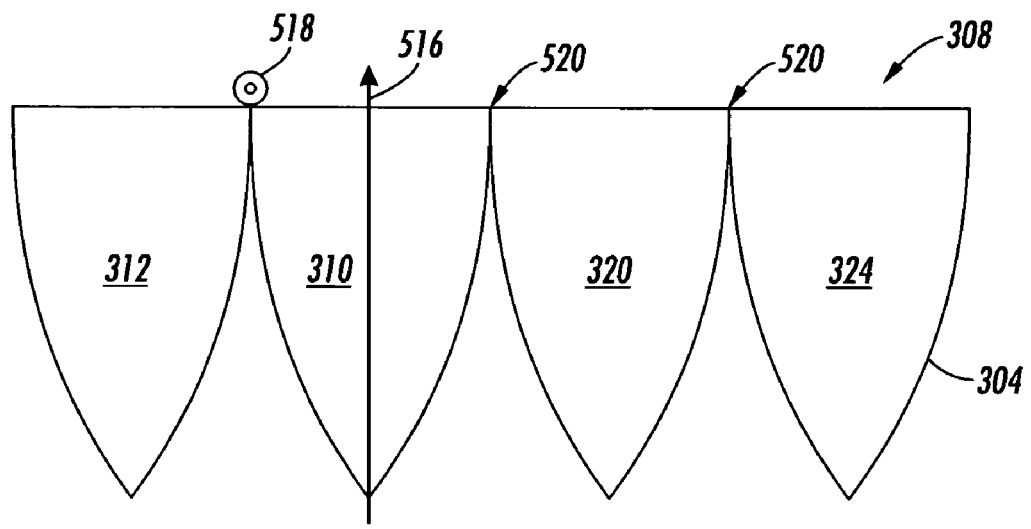
FIG. 3 shows a series of hemispherical segments formed in a plane.

FIG. 2 shows a hemisphere shaped sensor 204 that is formed from a pixel array sensor 308 shown in FIG. 3. As used herein, a "detector" or "photodetector" is broadly defined as a device that converts visible, infra-red or ultraviolet light into an electrical signal. As used herein, a "sensor" or "image sensor" is broadly defined to be a device that is made up of an array of photo-detectors and the interconnect lines that connect the photo-detectors in order to create an image.

Each image sensor typically includes an array of pixels. As used herein, "pixel" is defined as the smallest addressable unit of a sensor. Each pixel usually includes one or more photo-detector and transistor combinations. Interconnect lines connect together the pixels. As used herein, pixel "interconnect lines" will be broadly defined to include electrical signal paths on the image detector for getting information to and from each pixel. Such interconnect lines shall include both address lines and bias voltage connections. Address lines are defined to include both data lines and gate lines. This architecture is often referred to as a matrix addressed array. CMOS pixels, X-ray imaging pixels and the like are commonly used in matrix addressed arrays. Another form of pixel is based on the principle of charge coupling device (CCD) detectors. CCDs convert light into electrical signals and shift them along channels that interconnect adjacent CCD detectors.

An image sensor typically includes thin film transistors (TFTs) fabricated from an amorphous silicon, poly-silicon, an organic semiconductor, or a crystalline semiconductor such as a charge coupled device (CCD) or CMOS sensor. The image sensor, including all the detectors in the sensor are typically formed using standard semiconductor processing techniques, typically including photolithographic processes, on a single monolithic substrate that is subsequently cut and bent to form the desired curved shape. A wide range of detectors may be used. In one embodiment, the photo detector is an a-Si p-i-n device although the actual sensor technology used depends on the sensor wavelength and sensitivity requirements. Another embodiment uses an organic sensor as described by Street et al, Appl. Phys. Lett., 78, 4193, 2001. High fill factor sensors are used to achieve high sensor efficiencies, as described by J. T. Rahn et al, MRS Conf Proc, 557, 809, 2000. Color filters can be added to achieve color imaging by depositing a color filter layer over the sensor or by printing color filters directly over the photodiodes.

In FIG. 2, a lens 208 with a spherical (or aspheric depending on the lens design) focal plane receives incoming light and distributes the light across the interior surface of hemispherical shaped image sensor 204. Lens 208's focal plane coincides with the inner light sensing surface of the hemispherical sensor. Sensor photo-detectors convert the received incoming light into an electrical signal. Gate and data lines carry the electrical signal to the edge of the hemispherical sensor. Gate tabs 212 and data line tabs 216 may extend outward from the hemispherical sensor. The gate and data line tabs facilitate external wires 220 attachment to sensor gate and data lines. The external wires communicate sensor information to image processor 224.

The hemispherical sensor array is fabricated on a flat flexible substrate such as a plastic foil. Bending such a foil to form a cylindrical surface exposes the array material to only a small strain. However, forming a hemisphere from a flat film usually involves stretching with a strain that typically ranges from 10 to 100% depending on the angle subtended by the surface. As used herein, strain is a measure of the relative dimension change of the substrate and the sensor layers in response to a force. Most semiconductor device materials fail when subject to a strain exceeding 1-2%. A method of forming a curved image sensor on a flat flexible surface, by cutting the flat flexible surface into segments and bending the segments with low strain to form a desired curved surface is described. Optionally an additional strain inducing film can be applied to the surface of the array to cause additional curvature to closely approximate an exact hemispherical shape.

The example three dimensional segmented hemispherical image sensor of FIG. 2 is fabricated from the two dimensional pixelated image sensor segments shown in FIG. 3. As used herein, "segmented sensor" means that a "joint" exists between segments that bring into close proximity parts of the substrate that were further apart during fabrication The "joints" are high bend regions that sometimes may have a discontinuous first derivative at the joint. As used herein, a "curve" is defined as a surface that is not in a plane but has a continuous first derivative over the surface and generally where the strain is kept low, preferably below 2 percent.

In FIG. 3, the sensor "outline" or outer perimeter is defined to be an arrangement of image sensor segments such as segment 310, 312, 320, 324. The pixels are arranged in each segment to avoid address lines crossing sensor perimeter. In order to define the sensor perimeter shape, the sensor and underlying flexible substrate may be cut along the sensor perimeter 304 after sensor fabrication. Alternately, the sensor may be fabricated on a two dimensional substrate that is already formed in the desired shape.

Figure 4:
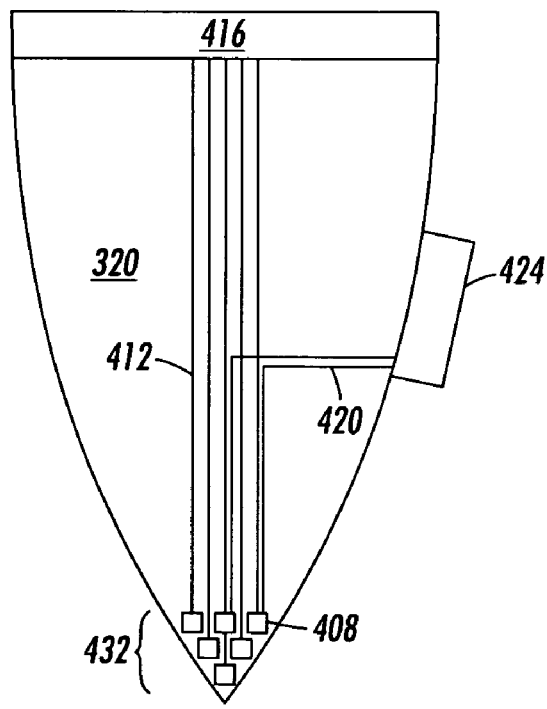
FIG. 4 shows an expanded view of a single hemispherical segment including gate and data lines for addressing pixels in the hemispherical segment.

FIG. 4 shows an expanded view of one segment 320 of the pixelated sensor. In FIG. 4, data lines 412 connect an array of pixels 408 to a data bus 416. Data bus 416 couples to external electronics. Gate lines 420 connects pixels 408 to a gate tab 424 that couples to external image processing electronics. Keeping the flexible substrate thin (between 2-5 mils) allows adjacent segments to overlap the gate tab without significantly adversely affecting the sensor depth of field.

Figure 5:
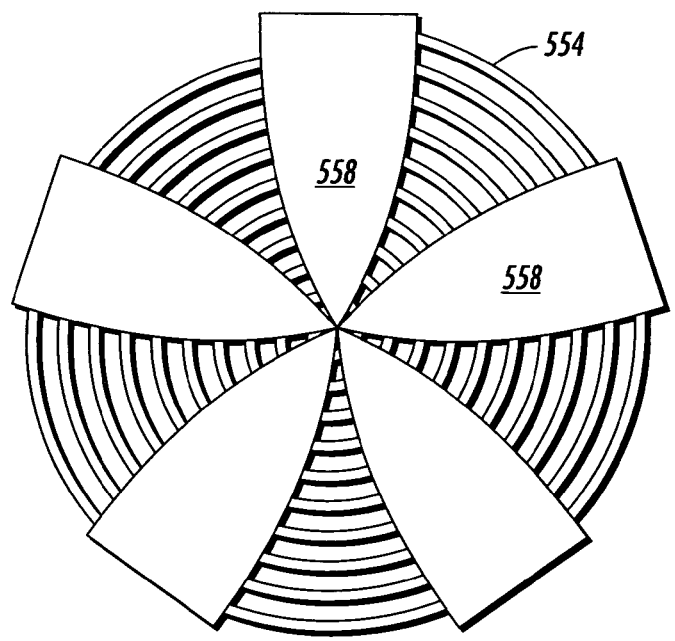
FIG. 5 shows one method of routing interconnect wires between image sensor segments while the sensor segments are still in a two dimensional plane.
Figure 6:
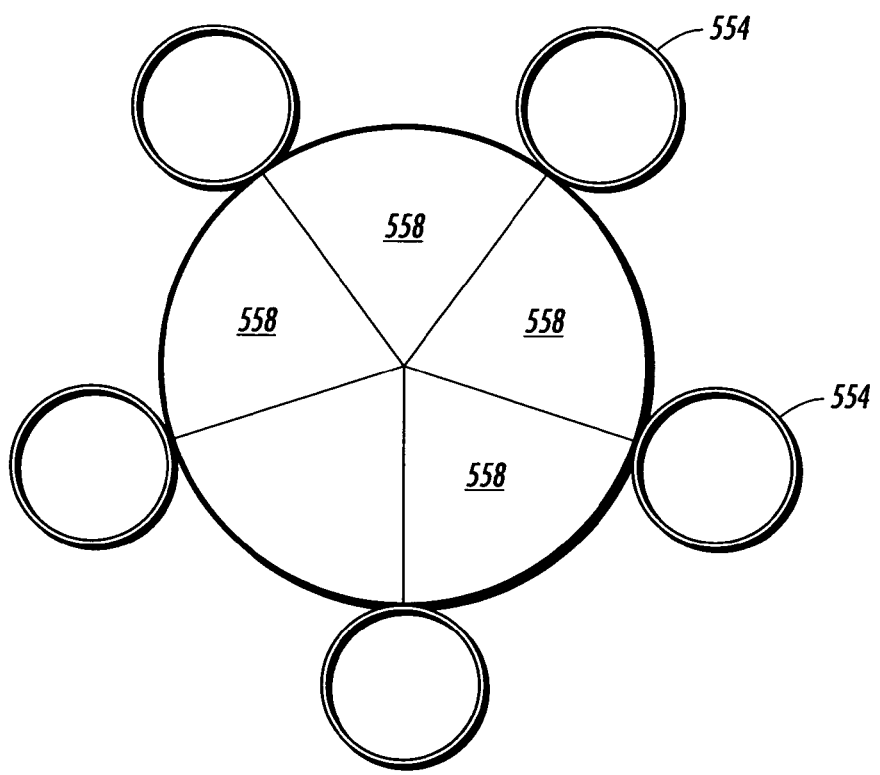
FIG. 6 shows a bottom view of the structure of FIG. 5 after the hemisphere segments are bent into a three dimensional hemispherical structure.

Signal line interconnection between separated segments (or different turns of a spiral arm) can be difficult, especially for matrix addressed pixel arrays. Typical matrix addressing scheme utilize two sets of signal lines (e.g. gate lines and data lines) crossing each other topologically orthogonal to define a matrix. In one embodiment, a first set of these orthogonal lines can be connected or wired out through a connected segment part such as data bus 416 in FIG. 4. The other set of lines can be either connected through external connections such as gate tab 424 of FIG. 4, or by fabricating an additional layer of metal lines routed through the connected part of the segments. Alternately, FIG. 5 shows the segments cut to include multiple narrow substrate strips 554 between image sensor hemisphere segments 558. The narrow strips 554 include interconnect lines that carry signals between pixels located on different image sensor segments 558. After assembly, these thin strips may deform in different curvature planes outside the arc of the hemisphere, external to and not interfering with the imaging surface. FIG. 6 shows a bottom view of the deformed strips 554 extending from the hemisphere formed by the hemisphere segments 558.

Figure 7:
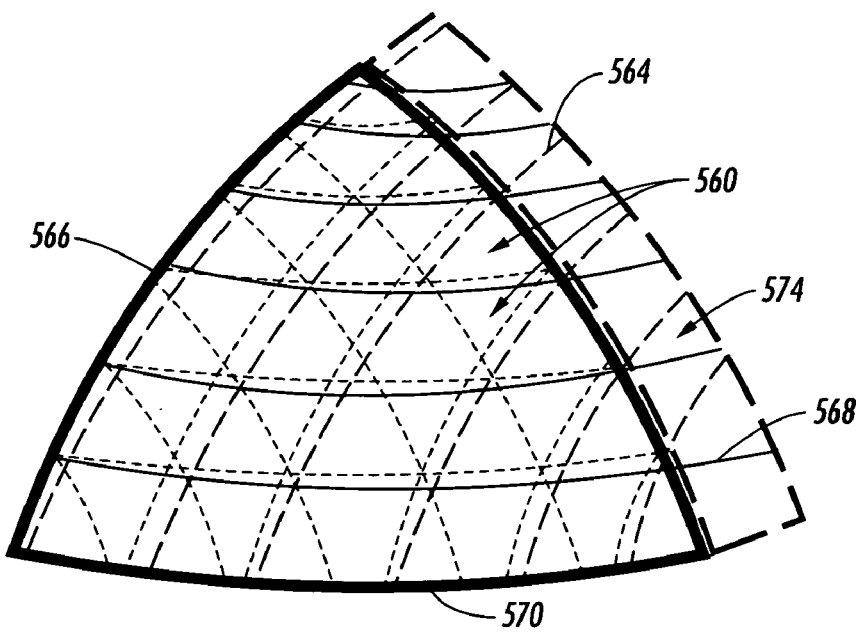
FIG. 7 shows an expanded view of a single hemispherical segment with an alternative gate and data line wiring pattern.

Although FIG. 4 shows one layout of potential address lines, other layouts are also possible. FIG. 7 shows an alternative layout using triangular pixels 560. Data lines 564 run approximately parallel to ones side 566 of the image sensor segment while select lines 568 run approximately parallel to a different side 570 of the image sensor segment. The data lines and the select lines terminate on a contact pad 574 that enables connections to external circuitry.

In one embodiment, the pixel distribution over the curved sensor surface is uniform. However, alternate embodiments include higher pixel density regions (higher resolution) and lower pixel density regions (lower resolution) on a common curved sensor surface. One example distribution includes higher resolutions near the middle of the image sensor field of view, such as region 432. Having higher resolutions near the middle of the sensor field of view simulates the light detectors in a human eye.

Although formation of image sensor structure 204 may be done by separately forming individual hemispherical segments such as segment 320, and placing them in a frame or mold that curves each segment, it is typically preferable to form all the segments already connected together on a single substrate as shown in FIG. 3. Forming the sensors segments together on a common substrate simplifies fabrication. As used herein, "bending" means applying a force that causes a discontinuity in the first derivative of the surface, typically at joint locations. As used herein, "flexing" means applying a force to curve the surface such that a discontinuity in the first derivative of the surface does not occur.

Forming the curved sensor segments on a common substrate and already connected offers several advantages. Fabricating the sensor on a common substrate allows alignment issues to be handled during the masking and formation of the sensor electronics. Alignment during image sensor fabrication is simpler then trying to align a number of discrete sensor segments after fabrication. Furthermore, forming all the pixels on a single substrate avoids process variations that may occur between different sensor batches. Finally, forming all the hemisphere segments interconnected on a single substrate avoids excessive spacing between pixels of adjacent hemispherical segments.

Figure 8:
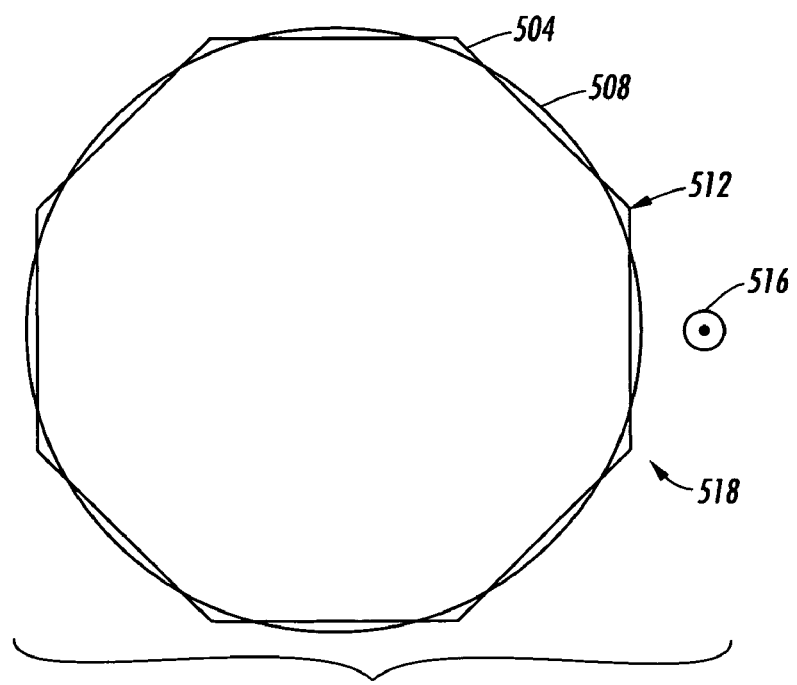
FIG. 8 shows a cross sectional view of a hemispherical sensor formed from hemispherical segments compared to an ideal hemisphere cross-section.

FIG. 8 shows a front cross sectional view of an eight segment hemispherical sensor formed using hemisphere segments similar to the segments shown in FIG. 3. Sensor walls 504 are made of hemispherical segments resulting in a sensor cross section that deviates slightly from a perfect circle 508. The deviations can be reduced by applying a force to the corners such as corner 512. The force flexes the segment resulting in a curvature along two directions. A first force flexes the hemisphere segment to cause a curvature along axis 516 of FIG. 3. The curvature along axis 516 creates the concave surface from the sensor center to the sensor edge. The second force causes a section curvature along axis along axis 518 of FIG. 3 to minimize the deviation from the circle by bowing the hemisphere across its width.

Curvature along two axis, particularly two orthogonal axes produces fabrication challenges. Minimizing the sensor substrate curvature in different directions is desirable because reduced flexing enables the use of a wider range of electronics and interconnects. For example, excessive flexing limits the intra-sensor wiring to elastomeric conductors such as low conductivity organic conductors. Excessive flexing can also limit the electronics used to moderate performance organic TFTs and photodiodes, which can generally withstand a larger strain that inorganic materials. Finally excessive flexing can result in dimensional stability problems making difficult high resolution photolithography.

Thus, to minimize curvature of each sensor region, it is desirable to limit each sensor segment to one direction of curvature. Closer approximations of an ideal circle in FIG. 8 while limiting the directions of curvature of each segment may be achieved by increasing the number of sensor segments. Using the structure shown limits the curvature of each sensor segment to a single direction along axis 516 of FIG. 3. Beside the curvature along axis 516, bending of the 2-D sensor occurs at the joints 520 between sensor segments. Bending typically occurs where pixels are not present avoiding issues related to electronics fabrication over substrate surfaces that will be highly stressed. Electrical lines also may avoid traversing the joint regions.

Deposition of a material layer on the substrate that has a built-in stress can create a strain in the surface to produce a curved shape. The choice of material and the pattern in which it is deposited allows selection of the preferred curved shape to best approximate a hemisphere. An example of a suitable material with a built-in stress is silicon oxide or nitride (or an alloy of these) deposited by sputtering or plasma-enhanced chemical vapor deposition PECVD). Descriptions of forming such stressed films are provided in "Thin Film Deposition; Principles and Practice", By D. L. Smith, which is hereby incorporated by reference.

Figure 9:
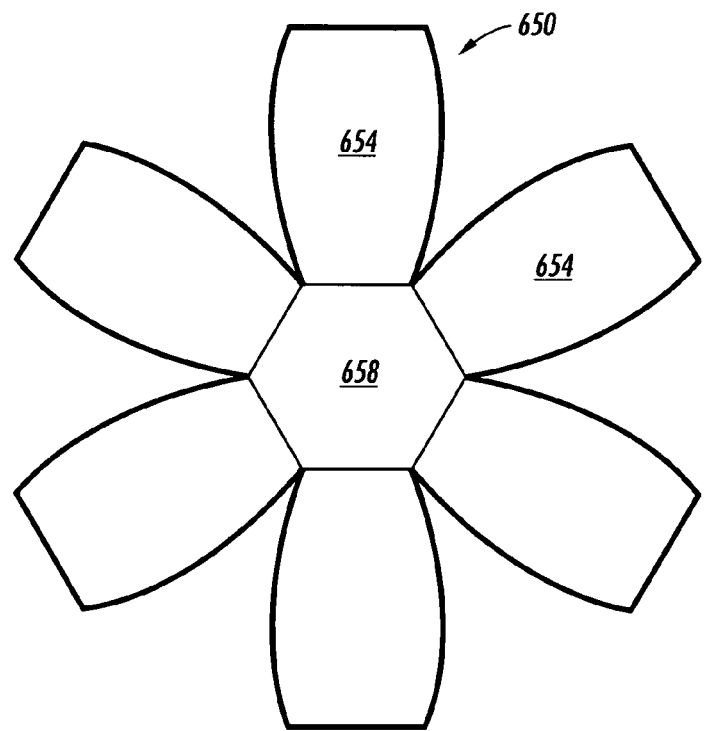
FIG. 9 shows an alternate embodiment of a series of hemispherical segments in a plane.
Figure 10:
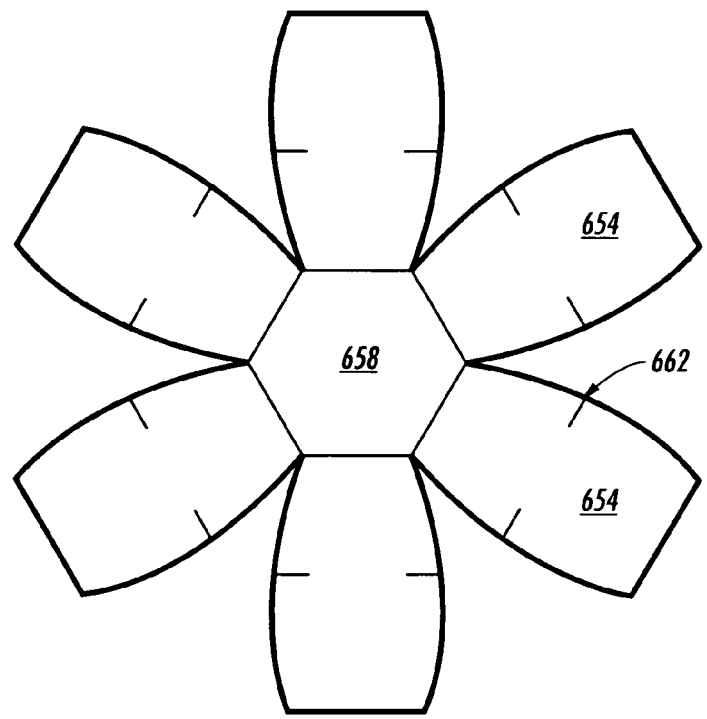
FIG. 10 shows cutting slots in the structure of FIG. 9 to facilitate bending
Figure 11:
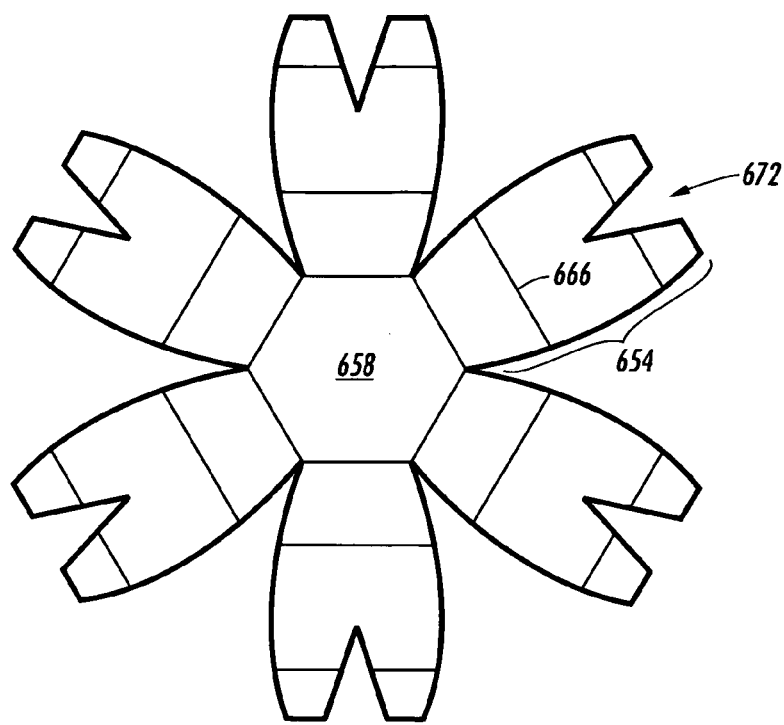
FIG. 11 shows a variation of the structure of FIG. 9.
Figure 12:
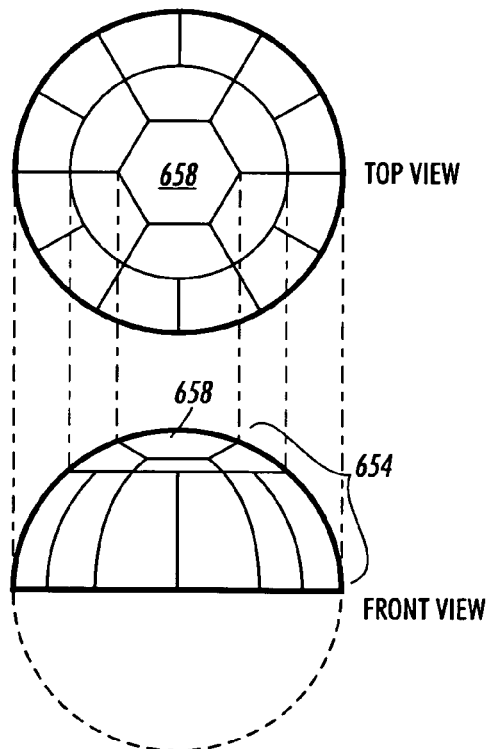
FIG. 12 shows a front and top view of the hemispherical segments of FIG. 11 after they have been bent into a hemisphere.

There are several alternative ways to design the segments that form the hemispherical sensor array. FIG. 9 shows a design embodiment 650 which is similar to FIG. 3, but the side segments 654 are joined to a middle segment 658. The middle segment 658 may be a small polygon from which the side segments extend. In general the more segments used, the closer is the approximation to a hemisphere. The designs of FIG. 3 and FIG. 9, can be subdivided or "slits" cut into the design to better approximate a hemisphere. FIG. 10 shows providing slits 662 in segments 654 to facilitate bending into a sphere. FIG. 11 shows a top view and FIG. 12 shows a side and corresponding top view of forming additional joints 666 and slits 672 in side segment 654 to more closely approximate a hemisphere. Each of these designs allows the pixel address lines to extend to the outer perimeter to make contact with external electronics.

Figure 13:
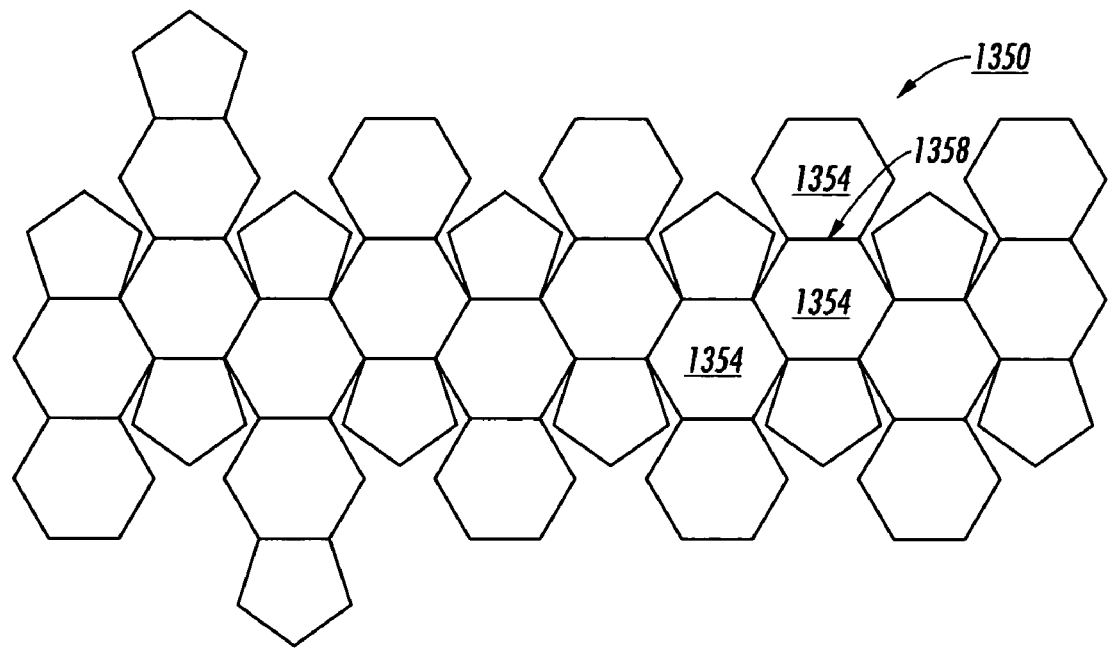
FIG. 13 shows a plurality of interconnected polygon hemispherical sensor segments formed in a plane.
Figure 14:
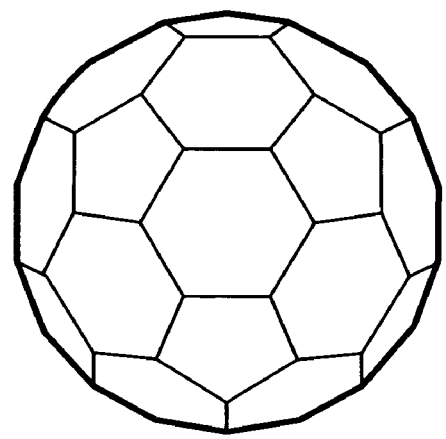
FIG. 14 shows the structure of FIG. 13 after it is formed into a hemisphere.
Figure 15:
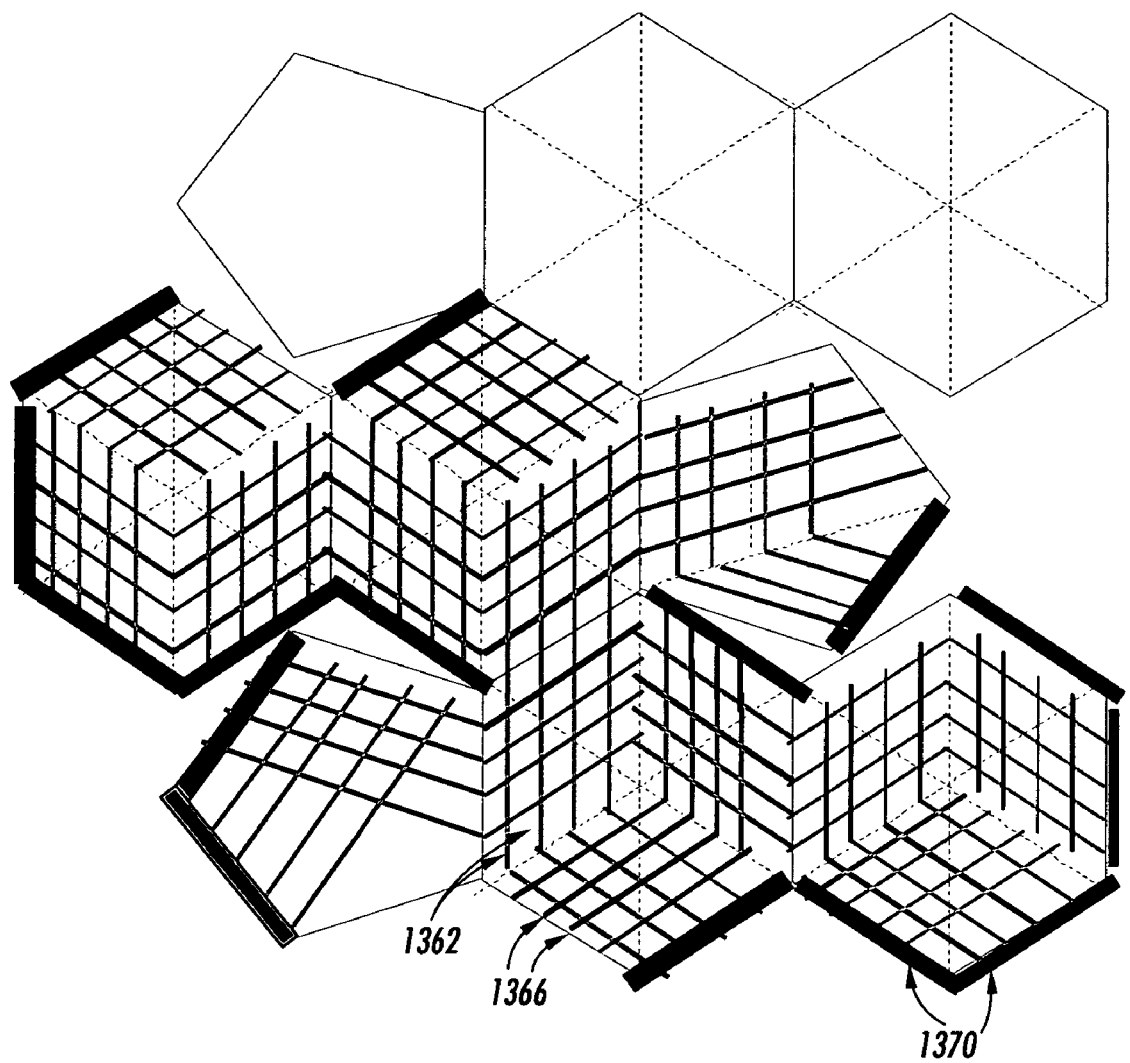
FIG. 15 shows a possible wire routing arrangement to connect the pixels in the structure of FIGS. 13 and 14.

An alternative type of segment design is based on connected polygons, as illustrated in FIG. 13. A combination of hexagons and pentagons or other shapes may be used to form an approximation to a spherical or hemispherical surface in a "soccer ball configuration". FIG. 13 shows the polygon pattern 1350, where each polygon is an image sensor segment 1354. The image sensor segments may be bent at joints 1358 to form a three dimensional curved image sensor as shown in FIG. 14. The polygons are interconnected so that address lines can be extended to the outer perimeter. As with other designs, a film with built-in stress can be applied to the substrate surface to add curvature to the polygon segments to improve the accuracy of the shape. FIG. 15 shows an example routing of address lines on each polygon segment that may also typically runs parallel to polygon edge. Gate lines 1362 and data lines 1366 terminate on contact pads 1370 to enable external electronics to couple to pixels in the image sensor.

Figure 16:
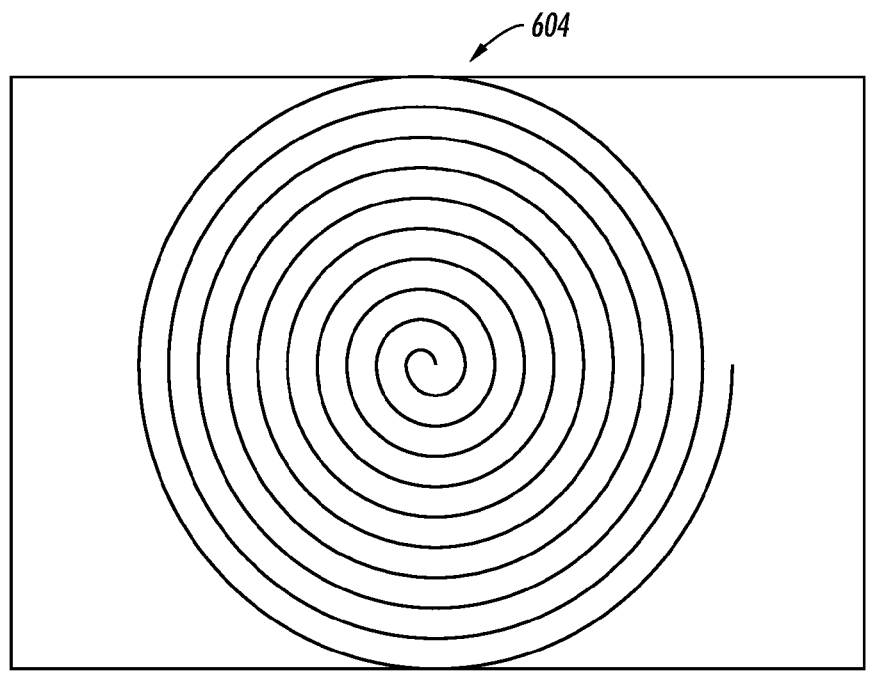
FIG. 16 shows a spiral pattern that may be used to form a hemispherical sensor.
Figure 17:
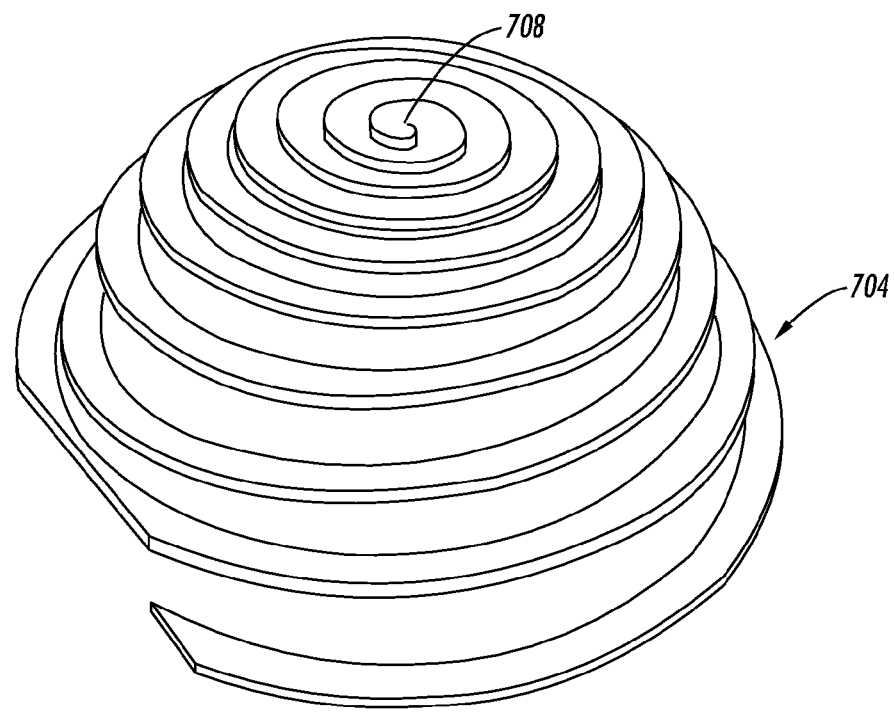
FIG. 17 shows the terraced hemispherical structure that results from separating the spiral segments of FIG. 6.

The previous methods describe forming a segmented sensor. An alternate method of forming a curved, typically spherical, sensor from a previously flat sensor is to form a planar spiral pattern 604 as shown in FIG. 16. FIG. 17 shows a hemispherical sensor 704 formed by deforming the flat spiral pattern 604. The gradual spiral pattern deformation produces minimal stress on sensor. The flex deformation is so slight per unit area that it is possible to use single crystalline silicon and traditional CCD and CMOS imagers provided the substrate over which the crystalline structures are formed is sufficiently thin. 10 micrometer thick crystalline silicon wafers have demonstrated the required flexibility for forming a curved spiral pattern sensor.

Figure 18:
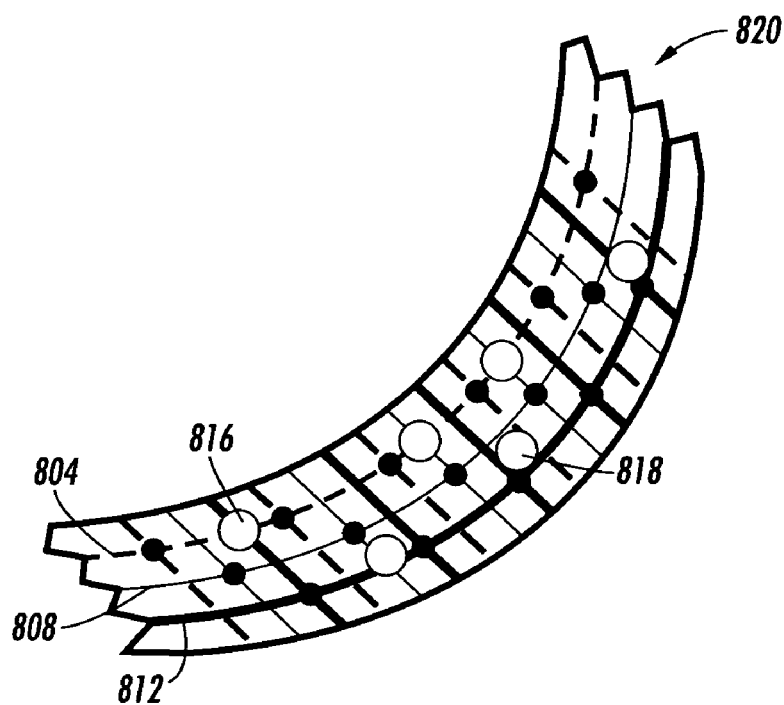
FIG. 18 shows a segment of the spiral sensor that uses a three phase time clock to shift information out of the spiral sensor.

Finding access points to read data from a spiral structure can be challenging. One possibility is to couple external wiring to the beginning of a spiral, point 708 of sensor 704 and sequentially shift the data through a CCD array, along the spiral arms, out to an image processor. As used herein, "spiral arms" are defined as segments of the spiral. FIG. 18 shows using three phase clock lines along address lines 804, 808, 812 to shift the output of pixels 816, 818 along spiral portion 820.

Figure 19:
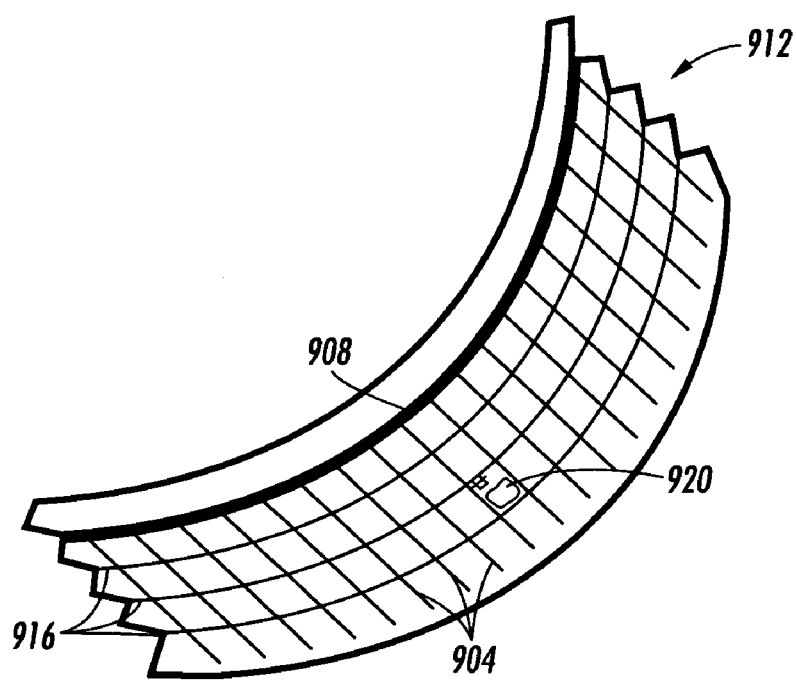
FIG. 19 shows a segment of a spiral sensor that uses shift registers coupled to gate lines and perpendicular data lines to get information from the spiral sensor.

FIG. 19 shows an alternative embodiment in which shift registers positioned along the spiral arm shifts data from pixels on the spiral to external wires connected to the beginning of the spiral. The illustrated embodiment is particularly suitable for CMOS sensors, although it can also be used for any matrix addressed pixel array. In one embodiment, the shift register use the same transistor types used in the pixel array. FIG. 19 shows gate lines 904 coupled to a plurality of shift registers 908 positioned along one side of spiral arm segment 912. Data lines 916 run almost parallel with the spiral pattern and approximately perpendicular to the gate lines. Photo-detectors 920, -, are located near the gate and data line intersection. The shift registers may also provide the voltages to drive the gate lines along the short span approximately perpendicular to the spiral arm direction. Although shifting the data along the spiral does not produce rapid sensor output, it has been found that the speed of Polysilicon TFT shift registers is adequate for slow video images or quasi static images. If higher speed images are needed, external wires may be coupled to additional access points or "data bus" points along the spiral.

The spiral arm width is highly variable. In theory, the spiral arm can be as thin as one pixel wide. CCD and CMOS pixels dimensions are on the order of 5 micrometers by 5 micrometers in area. Forming very thin spiral arms with the CCD sensors involves minimal overhead electronics because as previously described, the CCD sensors themselves serve as shift registers. However, with CMOS sensors or TFT active matrix photos sensor arrays, the shift registers will occupy substantial substrate real estate reducing the efficiency of the overall sensor if each shift register corresponds to too few pixels. Thus, CMOS and TFT spirals are typically somewhat wider.

Figure 20:
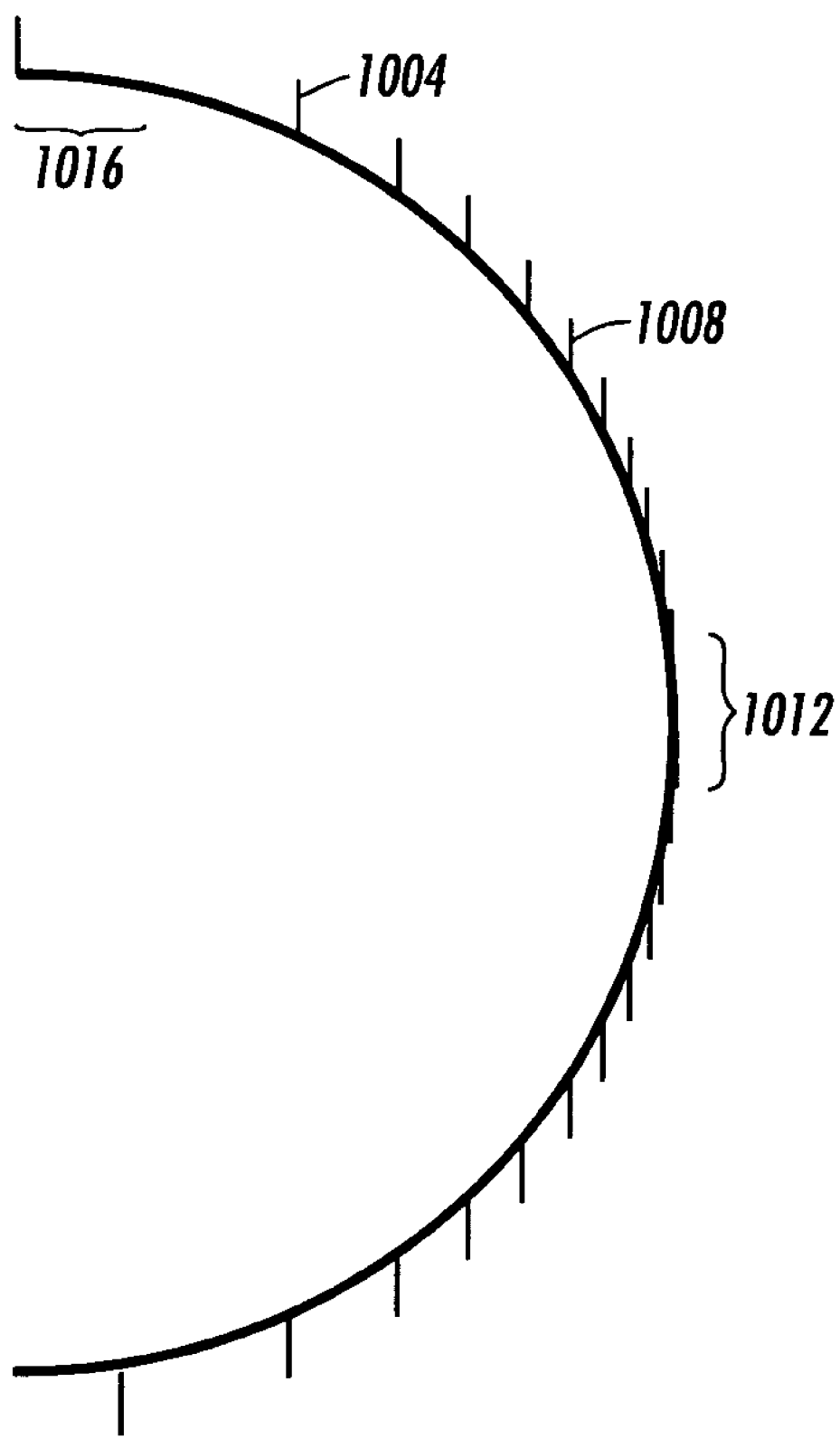
FIG. 20 shows a side cross sectional view of a terraced spiral sensor of FIG. 17.

Using spiral portions or "arms" that are excessively wide also has drawbacks. In particular, a basic spiral pattern in which the spiral segments are separated into a curved or hemispherical shape usually results in a terraced structure. FIG. 20 shows a side cross sectional view of a terraced structure including terraces 1004, 1008 arranged in a hemispherical shape. Near the center 1012 of the hemisphere, the flat surface is a good approximation of a hemisphere center. However near the hemisphere outer edges 1016 or "equator", the approximately parallel orientation of the terraced light sensing surfaces with center 1012 results in an outer edge that substantially deviates from the light sensor orientation in an ideal hemisphere outer edge.

Figure 21:
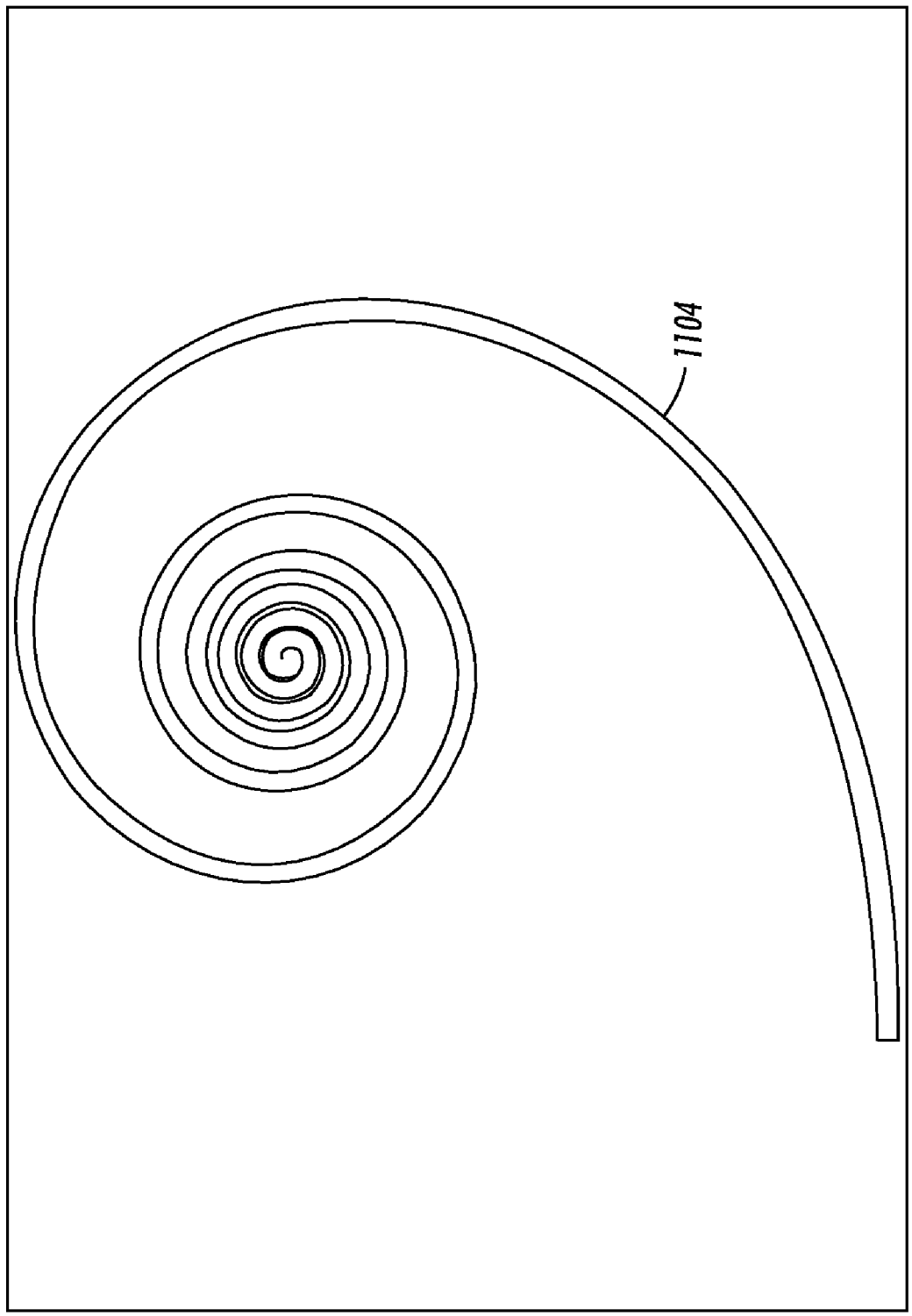
FIG. 21 shows a modified spiral pattern.
Figure 22:
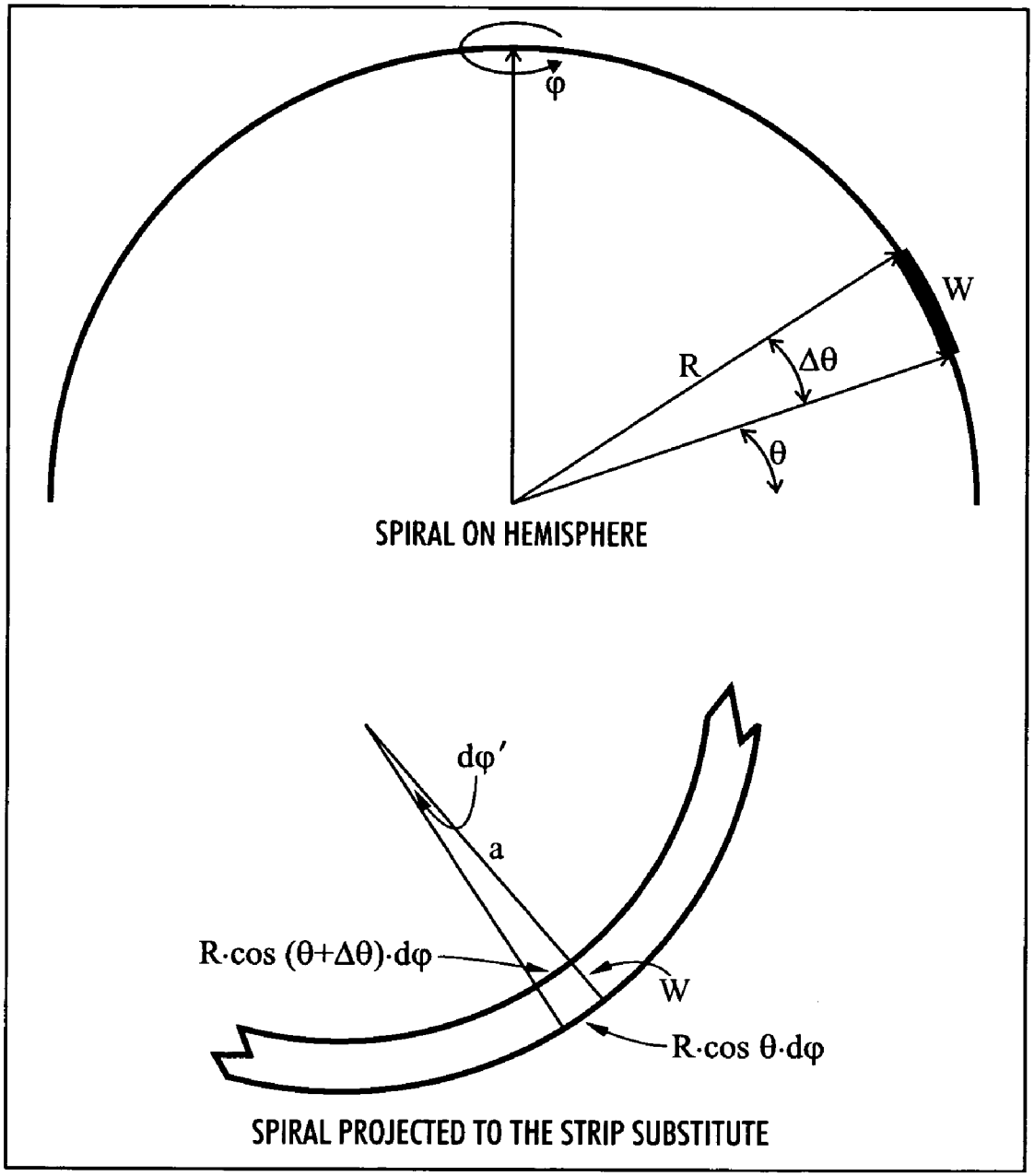
FIG. 22 shows projecting a spiral portion of a hemisphere onto a two dimensional substrate.

One method of correcting the terrace orientation is to use a quasi one dimensional spiral pattern to form the curved sensor. When assembled, the modified spiral pattern produces a hemisphere approximation with "terrace" surfaces oriented approximately tangential to the surface of a true hemisphere. FIG. 21 shows a modified strip spiral 1104. A mathematical expression for the modified strip spiral is provided as follows:

The mathematical expression can be found by assuming that n segments are used to approximate the entire hemisphere where as shown in the equations below as they relate to FIG. 22:

Assume we use n segments to approximate the whole hemisphere.

$$\Delta\theta = \pi/2 - n$$

The width of the segment and the quasi-1D strip $W = R \cdot \Delta\theta$
As a spiral on the hemisphere $d\phi = 4 - n \cdot d\theta$
The curvature of the quasi-1D strip substrate before deformation can be calculated as:

$$\frac{d\phi \cdot R \cdot \cos(\theta + \Delta\theta)}{d\phi \cdot a} = \frac{R \cdot \cos(\theta)}{A + W},$$

$$d\phi \cdot R \cdot \cos(\theta + \Delta\theta) = a \cdot d\phi'$$

$$d\phi' = \frac{R}{W} \cdot [\cos(\theta) - \cos(\theta + \Delta\theta)] \cdot d\phi$$

As can be seen from FIG. 21, the outer spirals of modified spiral 1104 has almost linear sections. In particular, as one moves from the center, the spiral segments go from being round to becoming more linear. Thus it may be efficient to form spiral segments separately to preserve sensor substrate real estate. Forming linear segments with other linear segments allows tighter packing of the spiral components on a substrate. After formation, the spiral components can be assembled together to form the desired spiral which can then be deformed into a curved three dimensional sensor. The three dimensional sensor may have various curvatures, usually concave, although a typical curvature shape is a hemispherical shape.

Figure 23:
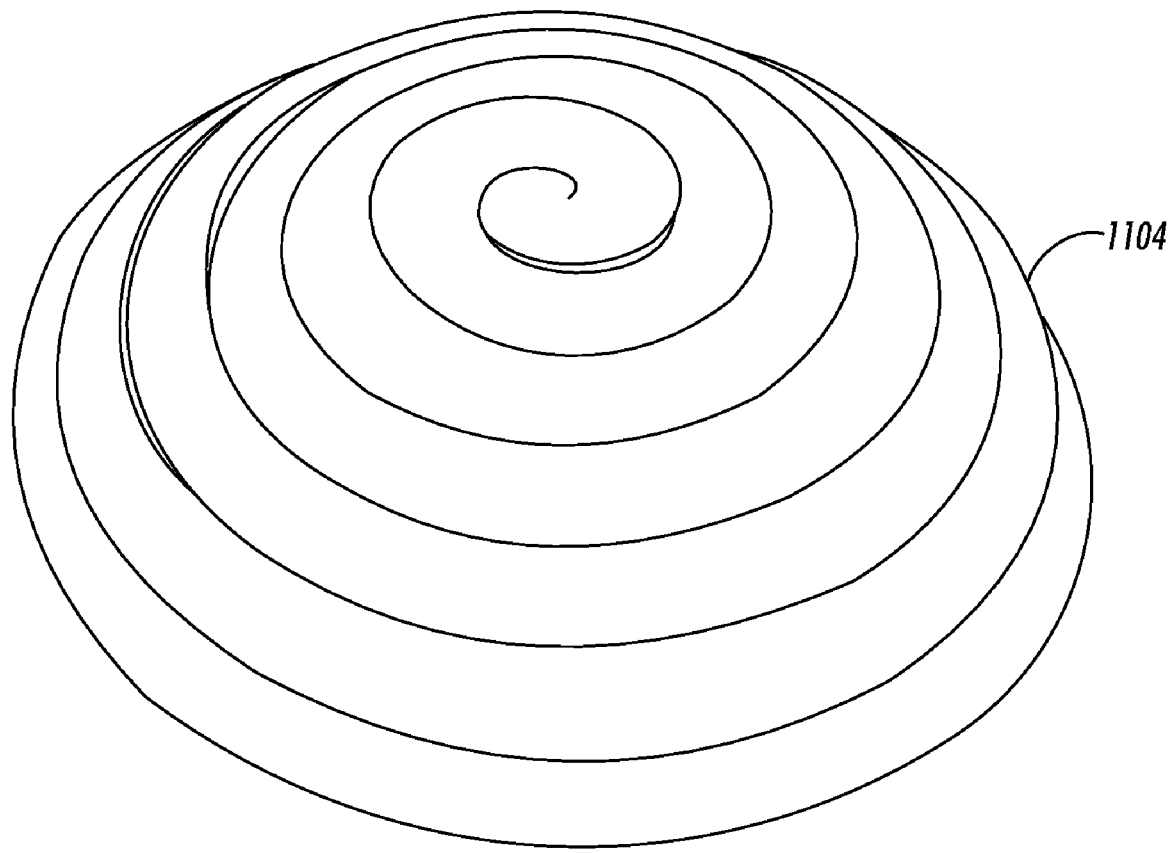
FIG. 23 shows the curved surface that results from forming a hemisphere from the modified spiral pattern.

FIG. 23 shows an example hemisphere made from the modified spiral 1104 of FIG. 21. Note that in FIG. 23, the outer edge hemisphere edge's lightsensing surface orientation is almost perpendicular with a plane containing the hemisphere center. In other curved structures, the orientation of the light sensing surface at the sensor edge typically forms an angle between 30 degrees and 90 degree with respect to a plane tangent to the sensor center.

Various methods may be used to generate a force that moves the spiral segments out of a two dimensional plane to form a curved structure. One method is to fabricate the spiral arms on a substrate with a predefined bi-axial stress gradient. Substrates with a bi-axial stress gradient will deform into curved surfaces. For small curvatures, Stoney's equation (G. Stoney, Proc. Roy. Soc. London, A82, 172, 1909) defines the radius of curvature as a function of the stress gradient. As the deformation increases beyond the substrate thickness, the substrate will curve in one direction and will be bi-stable in either curved direction. Therefore a simple circular shaped continuous substrate with a built-in stress gradient will not self-deform into a hemisphere However, cutting a spiral strip out of a substrate with a bi-axial stress gradient produces a natural spiral deformation that can form a concave structure such as a hemisphere.

Techniques for forming a stress gradient in a substrate are provided in various references. In one embodiment, a standard stress free substrate, such as a crystalline silicon wafer with a CCD or CMOS sensor formed thereon is engineered with the desired stress gradient. The stress gradient may be integrated into the wafer, or by coating a surface of the wafer, with a metal or dielectric thin film with a known stress, typically by varying the pressure during material deposition as described in U.S. Pat. No. 5,914,218 entitled "Method for Forming a Spring Contact" by Smith et al. which is hereby incorporated by reference. Once the spiral is cut from the overall substrate, the stress causes the spiral to "self-assemble" into the desired curved shape.

Alternate methods of engineering a built-in stress gradient into the sensor are available. For example, the sensor may be formed on epitaxially grown thin films or on silicon or compound semiconductors. The epitaxially grown thin film can be lattice engineered to have an appropriate stress profile to produce the desired substrate curvature.

The preceding description includes numerous details, geometries and structures that have been used to provide the hemispherical sensor. These details such as detectors used, substrates used and interconnect line layouts have been provided as examples to facilitate understanding of the invention and should not be used to limit the scope of the invention. Thus the invention should only be limited to the claims, as originally presented and as they may be amended, encompass variations, alternatives, modifications, improvements, equivalents, and substantial equivalents of the embodiments and teachings disclosed herein, including those that are presently unforeseen or unappreciated, and that, for example, may arise from applicants/patentees and others.

What is claimed is:

1. A segmented, curved sensor comprising:
    a first pixelated curved sensor segment on a substrate;
    a second pixelated curved sensor segment on the substrate, the first curved sensor segment and the second curved sensor segment joined together at a joint on the substrate to form at least a portion of a hemisphere, the first and second segments joined by address lines that curve out of the arc of the hemisphere formed by the first pixelated curved sensor segment and the second pixelated curved sensor segment.

2. The segmented, curved sensor of claim 1 further comprising:
    a third pixelated curved sensor segment, the third curved sensor segment joined to the second curved sensor segment to form at least a portion of a hemisphere.

3. The segmented, curved sensor of claim 2 wherein the joint between the first curved sensor segment and the second curved sensor segment is formed by bending the sensor in a region between the first curved sensor segment and the second curved sensor segment.

4. The segmented, curved sensor of claim 1 wherein the first curved sensor segment includes a plurality of pixels, each pixel addressed by a gate line and a data line.

5. The segmented, curved sensor of claim 4 wherein each pixel includes a thin film transistor.

6. The segmented, curved sensor of claim 1 wherein at least one of the pixelated curved sensor segments is a polygon.

7. An imaging system including a segmented hemispherical sensor comprising:
    a segmented hemispherical sensor made up of curved hemispherical sensor segments;
    a lens system that focuses light in a curved focal plane onto the segmented hemispherical sensor; and,
    an image processor that receives electrical signals from the segmented hemispherical sensor and generates an image.

8. The imaging system of claim 7 wherein the image processor couples to gate lines and data lines in the segmented hemispherical sensors.

* * * * *

UNITED STATES PATENT AND TRADEMARK OFFICE
CERTIFICATE OF CORRECTION

PATENT NO. : 7,742,090 B2
APPLICATION NO. : 11/644072
DATED : June 22, 2010
INVENTOR(S) : Robert A. Street, Jeng Ping Lu and Sanjiv Sambandan Page 1 of 1

It is certified that error appears in the above-identified patent and that said Letters Patent is hereby corrected as shown below:

In the Specifications

On column 8, line 3, the equation "$\Delta\Theta = \pi/2 - n$" should read -- $\Delta\Theta = \frac{\pi}{2-n}$ --;

On column 8, line 33, the word "...lightsensing..." should read -- ...light sensing... --.

Signed and Sealed this
Thirteenth Day of August, 2013

Teresa Stanek Rea
*Acting Director of the United States Patent and Trademark Office*